United States Patent
Hsu et al.

(10) Patent No.: US 9,563,102 B2
(45) Date of Patent: Feb. 7, 2017

(54) SIGNAL PROCESSING METHOD OF MULTIPLE MIRCO-ELECTRO-MECHANICAL SYSTEM (MEMS) DEVICES AND COMBO MEMS DEVICE APPLYING THE METHOD

(71) Applicants: Yu-Wen Hsu, Tainan (TW); Ying-Che Lo, Tainan (TW); Lu-Po Liao, Taipei (TW); Chia-Yu Wu, Kaohsiung (TW)

(72) Inventors: Yu-Wen Hsu, Tainan (TW); Ying-Che Lo, Tainan (TW); Lu-Po Liao, Taipei (TW); Chia-Yu Wu, Kaohsiung (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 28 days.

(21) Appl. No.: 14/676,216

(22) Filed: Apr. 1, 2015

(65) Prior Publication Data
US 2015/0355523 A1 Dec. 10, 2015

(30) Foreign Application Priority Data

Jun. 10, 2014 (TW) .............................. 103119982 A

(51) Int. Cl.
| | | |
|---|---|---|
| *G02F 2/00* | (2006.01) | |
| *G01C 19/5712* | (2012.01) | |
| *B81B 7/00* | (2006.01) | |
| *G01C 19/5776* | (2012.01) | |

(52) U.S. Cl.
CPC ................. *G02F 2/00* (2013.01); *B81B 7/008* (2013.01); *G01C 19/5776* (2013.01)

(58) Field of Classification Search
None
See application file for complete search history.

(56) References Cited

U.S. PATENT DOCUMENTS

| | | | |
|---|---|---|---|
| 2014/0260610 A1* | 9/2014 | McNeil .............. | G01C 19/5712 73/504.12 |
| 2015/0146885 A1* | 5/2015 | Fitzgerald .............. | H04R 3/005 381/98 |

\* cited by examiner

*Primary Examiner* — Hemang Sanghavi
(74) *Attorney, Agent, or Firm* — Tung & Associates

(57) ABSTRACT

This invention provides a signal processing method of multiple micro-electro-mechanical system devices. The signal processing method includes: providing at least two MEMS devices; applying driving or modulating signals of different frequencies to the MEMS devices such that the MEMS devices generate respective MEMS signals with respective frequencies; and combining the MEMS signals with respective frequencies into one or more multi-frequency signals and outputting the multi-frequency signals, wherein a number of the multi-frequency signals is less than a number of the MEMS signals with respective frequencies. This invention also provides a combo MEMS device integrating two or more MEMS devices and two or more vibration sources.

15 Claims, 3 Drawing Sheets

SIGNAL PROCESSING METHOD OF MULTIPLE MIRCO-ELECTRO-MECHANICAL SYSTEM (MEMS) DEVICES AND COMBO MEMS DEVICE APPLYING THE METHOD

CROSS REFERENCE

The present invention claims priority to TW 103119982, filed on Jun. 10, 2014.

BACKGROUND OF THE INVENTION

Field of Invention

The present invention relates to a signal processing method of multiple micro-electro-mechanical system (MEMS) devices, in particular a signal processing method wherein multiple driving or modulating signals of different frequencies are applied to multiple integrated MEMS devices to generate multiple corresponding major frequency responses, and the major frequency responses are transmitted by at least one multi-frequency signal through at least one common node to a demodulator whereby the multi-frequency signal is demodulated, wherein the numbers of the multi-frequency signal and the common node are both less than the number of the major frequency responses, such that the required wirings and signals are reduced.

Description of Related Art

MEMS devices are commonly used nowadays. In developing MEMS devices, reduction of size is one important goal. For example, a portable device in which a MEMS device is applied to needs to be light and slim for fashion, and easy to carry. Currently MEMS devices can integrate an electronic circuit and a MEMS structure into one chip or one module. However, there is only one MEMS structure which is integrated in the MEMS device, and the MEMS structure provides only one sensing function. When the portable device needs two or more MEMS functions (such as a gravity sensor and an accelerometer, or an angular velocity sensor and angular accelerometer), conventionally, it requires at least two separate MEMS devices, which occupies a large space; further, the related connection wirings also occupies a large space which is disadvantageous in terms of product size reduction.

Therefore, it is desired to reduce the space required by plural MEMS devices and the related connection wirings so that the product size can be reduced.

SUMMARY OF THE INVENTION

In one perspective, the present invention provides a signal processing method of multiple MEMS devices, including: providing at least two MEMS devices; applying a plurality of vibration signals of different frequencies to the MEMS devices such that the MEMS devices respectively generate a plurality of MEMS signals with respective frequencies; and combining the MEMS signals with respective frequencies into one or more multi-frequency signals, and outputting the multi-frequency signals; wherein a number of the multi-frequency signals is less than a number of the MEMS signals with respective frequencies.

In one embodiment, the method further includes: transmitting the multi-frequency signals to a demodulator for separating the multi-frequency signals into a plurality of frequency responses; and analyzing sensing results of the MEMS devices according to the frequency responses.

In one embodiment, at least one of the MEMS signals with respective frequencies includes a major frequency response and at least one minor frequency response.

In one embodiment, the MEMS device generating the major frequency response and the at least one minor frequency response is an angular velocity sensor, and there is a 90° phase difference between the major frequency response and one of the at least one minor frequency response.

In one embodiment, at least one of the MEMS devices is a multi-dimensional acceleration sensor, which generates sensing signals having components in two or more dimensions. Driving or modulating signals of the same frequency or different frequencies are applied to different components in different embodiments.

In one embodiment, the step of applying driving or modulating signals of different frequencies to the MEMS devices includes: applying the driving or modulating signals by a mechanical vibration source or an electrical oscillation source.

In one embodiment, the at least two MEMS devices are integrated in a combo MEMS device.

According to another perspective, the present invention provides a combo MEMS device including: a plurality of MEMS devices; a plurality of vibration sources, for respectively generating a plurality of driving or modulating signals of different frequencies applied to the MEMS devices to generate a plurality of MEMS signals with respective frequencies; and at least one common node, for collecting the MEMS signals with respective frequencies generated by the MEMS devices when the MEMS devices receive the driving or modulating signals, combining the MEMS signals with respective frequencies into at least one multi-frequency signal, and outputting the multi-frequency signal, wherein a number of the common node is less than a number of the MEMS signals with respective frequencies.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, to show the interrelations between the components or devices, but not drawn according to actual scale.

Figure 1:
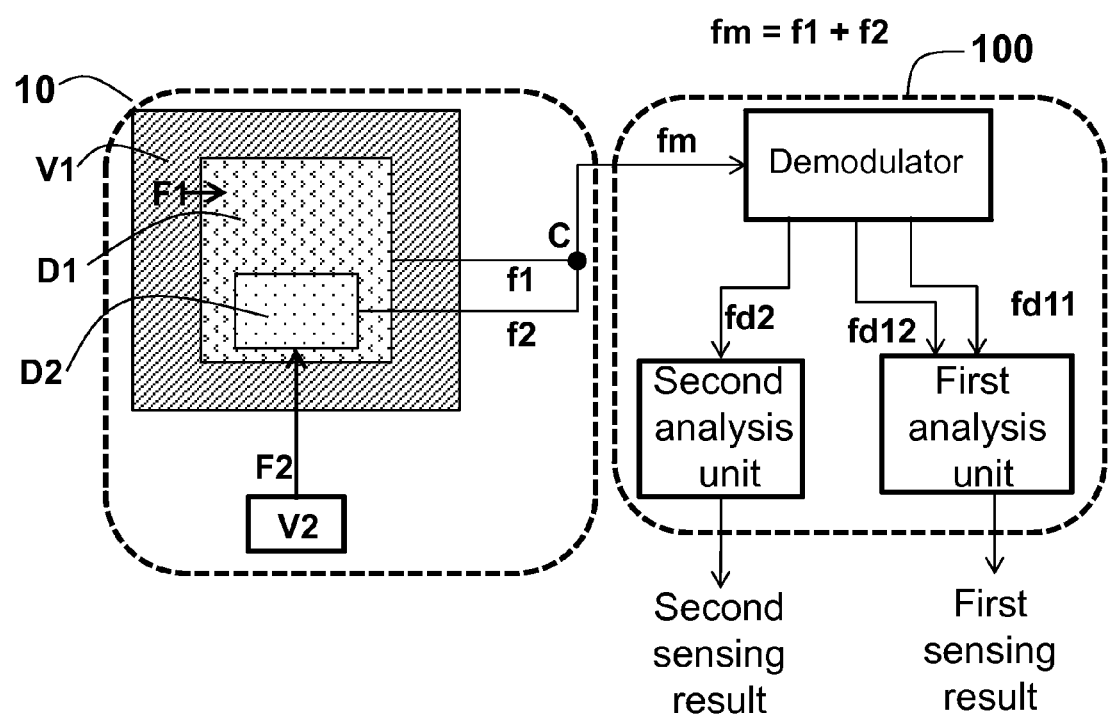
FIG. 1 shows a MEMS device and a processing unit according to one embodiment of the present invention.

Please refer to the left side of FIG. 1; according to one perspective of the present invention, a combo MEMS device 10 is provided, which includes: a plurality of MEMS devices D1 and D2 integrated in the combo MEMS device 10; a plurality of vibration sources V1 and V2, respectively generating a plurality of driving or modulating signals F1 and F2 of different frequencies which are respectively applied to the MEMS devices D1 and D2, wherein the number of the vibration sources V1 and V2 (or the number of the driving or modulating signals F1 and F2) for example can be, but not limited to, corresponding to the number of the MEMS devices, or corresponding to a total number of the components of sensing signals generated by the MEMS devices D1 and D2 (one MEMS device can generate sensing signals of multiple dimensions, such as but not limited to in x, y and z directions, which are referred to as "components of sensing signals" and will be explained in detail later); and at least one common node C, collecting the MEMS signals f1 and f2 with respective frequencies generated by the MEMS devices D1 and D2 as they receive the driving or modulating signals F1 and F2, combining the MEMS signals f1 and f2 into a multi-frequency signal fm, and outputting the multi-frequency signal fm to a processing unit 100 which analyzes the sensing results of the MEMS devices D1 and D2; wherein the number of the common node is less than the number of the MEMS signals with respective frequencies. The driving or modulating signals F1 and F2 for example can be, but not limited to, signals with mechanical vibration frequencies or signals with electrical oscillation frequencies.

The aforementioned "integrated" means that the MEMS devices D1 and D2 use the same wiring(s) to communicate with outside of the combo MEMS device, and they are preferably formed into one single module.

According to the present invention, the sensing signals generated by the MEMS devices D1 and D2 are modulated by different frequencies, and the frequency-modulated sensing signals are combined into at least one multi-frequency signal fm (that is, if there are more than two MEMS devices or more than two components of sensing signals, there can be more than one multi-frequency signal fm, and the number of the multi-frequency signals fm is less than the number of the MEMS devices). Thus, the required number of the common nodes C is reduced (as compared with the conventional approach which requires common nodes with a number corresponding to the number of the MEMS devices), as well as the required number of the corresponding wirings.

More specifically, although in one preferable embodiment of the present invention, only one common node C is required; however, the present invention is not limited to using one common node to combine the plural MEMS signals with respective frequencies into one multi-frequency signal. In another embodiment, the number of the common nodes C can be plural but still less than the number of the MEMS signals with respective frequencies. For example, if the MEMS device D1 is an angular velocity sensor and the MEMS device D2 is a 3-dimensional acceleration sensor which generates sensing signals including components of three directions, and the components in different directions generate different MEMS signals with respective frequencies by the same vibration source V2, then the MEMS signals with respective frequencies corresponding to different components can be collected through different common nodes, whereas the vibration response of the angular velocity sensor can be combined with one or more of the MEMS signals with respective frequencies of the components to become one multi-frequency signal. In other words, conventionally, four nodes are required for transmitting one angular velocity signal and three acceleration signals for three dimensions, but in the present invention, if at least one of the acceleration signals is combined with the angular velocity signal into a multi-frequency signal, the number of the nodes can be less.

The number and type of the MEMS devices are not limited to the aforementioned two MEMS devices D1 and D2; there can be three or even more MEMS devices integrated together. For example, MEMS device D1 is an angular velocity sensor; MEMS device D2 is a linear acceleration sensor; and there is one still other MEMS device (such as the MEMS device D3 shown in FIGS. 3A and 3B) which is a pressure sensor. Moreover, the vibration sources V1 and V2 in cooperation with the MEMS devices D1 and D2 can be implemented by a different number and a different arrangement not limited to the embodiments as shown in the figures. For example, if the MEMS device D2 is a 3-dimensional acceleration sensor generating sensing signals having components in three dimensions (for example, in-plane X and Y directions and out-of-plane Z direction, not shown), for each direction, a corresponding vibration source of a different frequency can be provided. But certainly, in another embodiment, one vibration source of same frequency can be used, and the components in different dimensions are modulated according to this same vibration source to generate MEMS signals with respective frequencies of the same frequency. Because each MEMS signal has a different direction, although the frequency is the same, different MEMS signals with respective frequencies can still be identified in and after demodulation.

Embodiments of the vibration sources include, but not limited to, a mechanical vibration source providing a mechanical vibration frequency (which for example vibrates the MEMS device D2 linearly), or an electrical oscillation source providing an electrical oscillation frequency (for example, providing multiple high and low voltage signals of different frequencies respectively coupled to top and bottom electrodes of differential capacitors). In one embodiment using the mechanical vibration source, preferably, the applied vibration has a direction which is different from the corresponding component. However, when the applied vibration has a direction which is the same as the corresponding component, the component can be identified by proper demodulation because different components have different directions). Regarding the combo MEMS device integrating multiple MEMS devices, the figures of Taiwan patent application No. 103125659 show several layout designs.

In one embodiment, for certain types of MEMS devices, the MEMS signal includes a major frequency response and at least one minor frequency response which are generated by the MEMS device when the MEMS device receives a vibration signal. The minor frequency response includes the major frequency component(s) of the generated vibration response, and the major frequency response includes other frequency component(s). For example, when the MEMS device is a Coriolis sensor, it will generate a major frequency response and a minor frequency response which have a 90° phase difference in between. Referring to the right side of FIG. 1, the processing unit 100 receives a multi-frequency signal fm from the combo MEMS device 10, and demodulate the multi-frequency signal fm to extract the frequency responses which can be analyzed to obtain the sensing results of the MEMS devices. The processing unit 100 includes a demodulator and a plurality of analysis units. The demodulator extracts the frequency responses fd11, fd12, and fd13 from the multi-frequency signal fm according to different frequencies or different phases, and transmits the frequency responses fd11, fd12, and fd13 to corresponding analysis units. For example, in this embodiment, the MEMS device D1 is a Coriolis sensor and the MEMS device D2 is a linear acceleration sensor; the frequency response fd11 is a minor frequency response having a same phase angle as the vibration signal and the frequency response fd12 is a major frequency response having a 90° phase difference with respect to the vibration signal. The major frequency response fd12 is the frequency response generated by Coriolis acceleration in the Coriolis sensor. The major frequency response fd2 is the frequency response generated by the linear acceleration sensor D2. The analysis units receive and analyze the frequency responses fd11 and fd12, and fd2 respectively, to output the sensing results of the MEMS devices. The aforementioned embodiment assumes that each MEMS device generates a sensing signal having only one component; however, if one MEMS device generates sensing signals having two or more components, by the principle as described above, the different components can be extracted as well.

In frequency domain, the minor frequency response fd11 and the major frequency response fd12 are the signals of same frequency. In time domain, the minor frequency response fd11 and the major frequency response fd12 have a substantially 90° phase difference. The demodulator can separate the major frequency response fd12 from the minor frequency response fd11 accordingly.

The number of the multi-frequency signal (s) received by the processing unit 100 is not limited as shown in the figure; the number can be more. For example, one mechanical vibration source vibrating a 3-dimensional acceleration sensor can generate three (or more) MEMS signals corresponding to components in three directions (such as the aforementioned X, Y, and Z directions). These MEMS signals can be combined with other MEMS signals of another MEMS device into multiple multi-frequency signals. Although there are more than one multi-frequency signal to be outputted, in comparison with the prior art wherein each MEMS device independently outputs its own signals, the present invention has the benefit of fewer number of signals to be outputted (the multi-frequency signals) and accordingly fewer number of common nodes that are required.

Figure 2:
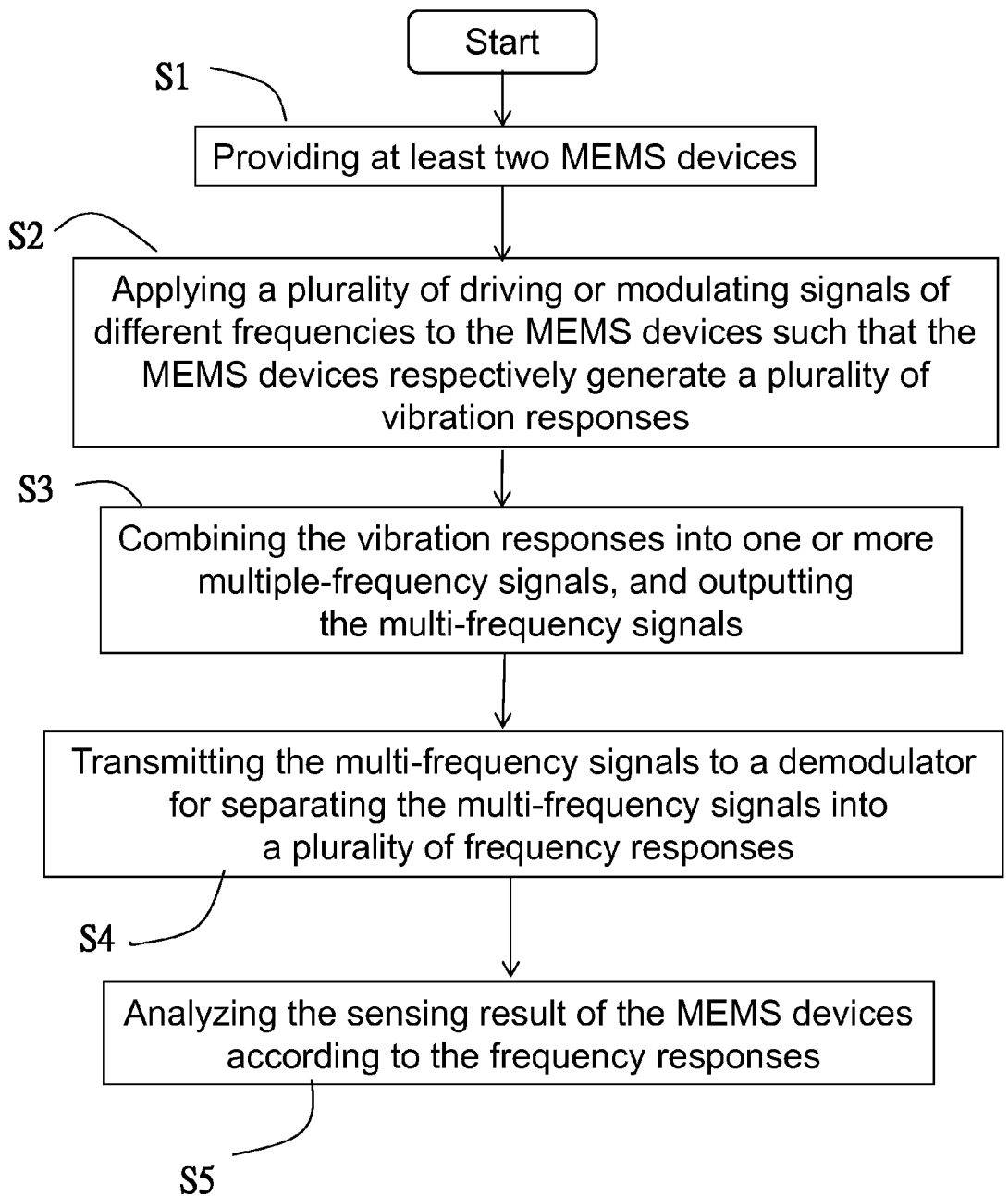
FIG. 2 shows a flowchart of a signal processing method according to one embodiment of the present invention.

FIG. 2 shows a flowchart of a method for processing signals of multiple MEMS devices, which for example can be used for processing signals generated by the combo MEMS device 10. The signal processing method includes: providing at least two MEMS devices (S1); applying driving or modulating signals of different frequencies to the MEMS devices respectively such that the MEMS devices respectively generate MEMS signals with respective frequencies (S2); and combining the MEMS signals with respective frequencies into one or more multi-frequency signals, and outputting the multi-frequency signals (S3); wherein a number of the multi-frequency signals is less than a number of the MEMS signals with respective frequencies. Referring to FIG. 1, the aforementioned steps can be executed by the combo MEMS device 10, and the at least two MEMS devices are integrated in the combo MEMS device 10.

In one embodiment, the method further includes: transmitting at least one of the multi-frequency signals to a demodulator for separating the multi-frequency signal into a plurality of frequency responses (S4); and analyzing the sensing results of the MEMS devices according to the frequency responses (S5). Referring to FIG. 1, the aforementioned steps (S4 and S5) can be executed by the processing unit 100.

The aforementioned step "applying driving or modulating signals of different frequencies to the MEMS devices" means that the frequencies of the driving or modulating signals applied to different MEMS devices are different. However, the driving or modulating signals applied to different components of sensing signals of one MEMS device can have one same or multiple different frequencies; for example, the driving or modulating signals having the same frequency can be generated by a mechanical vibration source, and the driving or modulating signals of different frequencies can be generated by an electrical oscillation source. In other words, one MEMS device can receive plural driving or modulating signals of the same or different strengths, to generate corresponding MEMS signals with respective frequencies.

In the embodiment of FIG. 1, the number of the vibration sources is the same as the number of the MEMS devices; however, the number of the vibration sources is not limited to being the same as the number of the MEMS devices, but can be different. Further, the integration of the MEMS devices D1 and D2 is not limited to accommodating them in one common region as shown in FIG. 1; different MEMS devices, or a part of one or more of the MEMS devices, can be accommodated in different regions, with at least one common node collecting the MEMS signals with respective frequencies to generate the at least one multi-frequency signal.

Considering that there may be a damping effect in each MEMS device structure, that the transmission of the major frequency response may be affected by a possible impedance in the transmission path, and that there possibly may be a deviation in manufacturing the MEMS devices, the frequency interval between the frequencies of different driving or modulating signals is preferably large enough so that different major frequency responses of different sensing signals are not mistaken one from another.

Figure 3A:
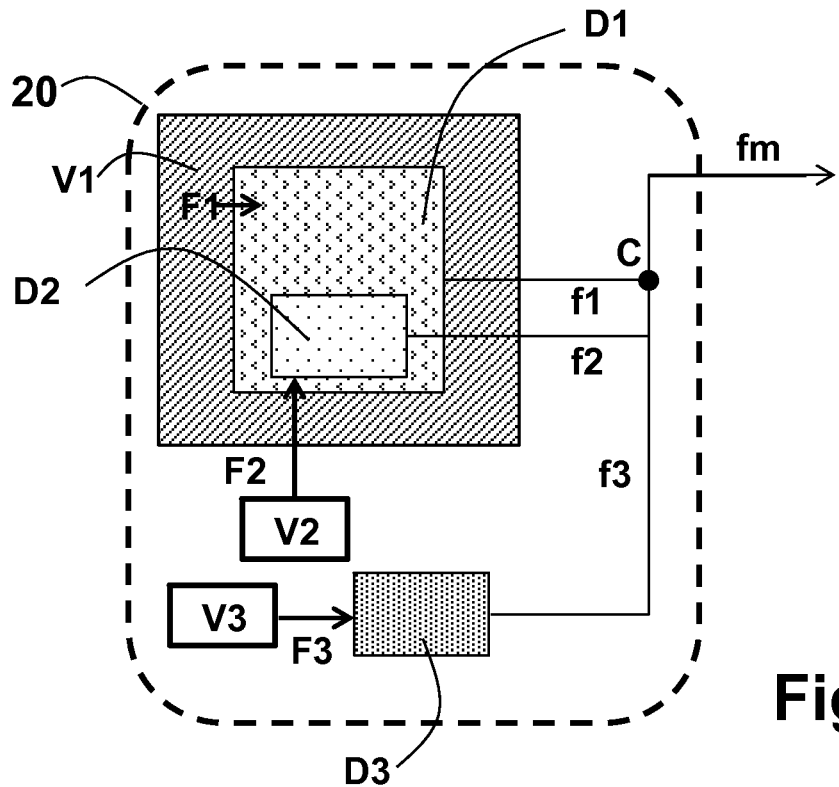
FIGS. 3A and 3B respectively show how the MEMS devices are integrated according to two embodiments of the present invention.
Figure 3B:
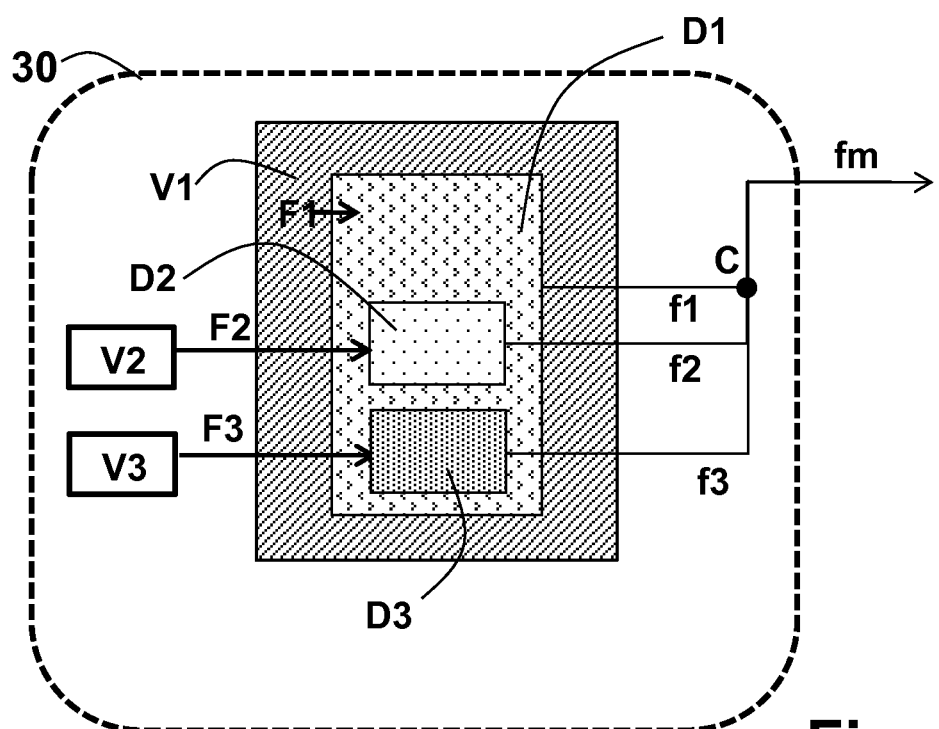

FIGS. 3A, and 3B show two embodiments to arrange three MEMS devices in a combo MEMS device. The combo MEMS devices 20 and 30 include three MEMS devices, wherein the MEMS device D1 for example can be an angular velocity sensor, the MEMS device D2 for example can be a linear acceleration sensor, and the MEMS device D3 for example can be a pressure sensor. Certainly there can be more than three MEMS devices and the three MEMS devices are not limited to the three aforementioned MEMS devices. The three MEMS devices in the two aforementioned embodiments are for illustrative purpose. In one embodiment, if the operation of the MEMS device D3 has no or has only trivial influence on the operation of the MEMS device D1, then the MEMS devices D3 and D2 can be accommodated in the MEMS device D1 (as shown by the combo MEMS device 30 in FIG. 3B). In another embodiment, for example, when the mass and springs of the MEMS device D3 have characteristics which are close to the characteristics of the mass and springs of the MEMS device D1 such that the vibration of one MEMS device D1 or D3 will influence the other, then the MEMS device D3 can be located outside the MEMS device D1 (as shown by the combo MEMS device 30 in FIG. 3A). In either embodiment, the signal processing method described above van be applied, to analyze the sensing results (such as a first sensing result and a second sensing result as shown in FIG. 1) of the MEMS devices.

The MEMS signals can have different frequencies with a frequency difference larger than a tolerance interval, and the tolerance interval can be determined based on system characteristics or signal characteristics; for example, in one embodiment, if two driving or modulating signals of near-by frequency ranges have an overlapping frequency range, the amplitude of the signal in this overlapping frequency range can be set not higher than a predetermined ratio of a highest amplitude of the vibration signal. The predetermined ratio can be decided according to practical needs.

In comparison with prior art, the present invention has the advantages of smaller size, fewer number of external wirings, and fewer pads for connecting the external wirings. In addition, the parasitic effect of the present invention is much less than the prior art, and signal transmission accuracy is improved.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, if the MEMS devices are not integrated in one combo MEMS device but are separately disposed, the present invention can still be applied, to apply driving or modulating signals of different frequencies to different MEMS devices to generate different frequency responses, and to combine the frequency responses into at least one multi-frequency signal. Therefore, the scope of the present invention should cover such and other variations and modifications. An embodiment or a claim of the present invention does not need to achieve all the objectives or advantages of the present invention. The title and abstract are provided for assisting searches but not for limiting the scope of the present invention.

What is claimed is:

1. A method for processing signals of multiple micro-electro-mechanical system (MEMS) devices, comprising:
   providing at least two MEMS devices of different functions including at least two of the following functions: sensing gravity, sensing acceleration, sensing angular velocity, and sensing angular acceleration;
   applying a plurality of driving or modulating signals of different frequencies to the MEMS devices of different functions such that the MEMS devices of different functions respectively generate a plurality of MEMS signals of corresponding different functions with respective frequencies; and
   combining the MEMS signals of corresponding different functions with respective frequencies into one or more multi-frequency signals, and outputting the multi-frequency signals;
   wherein a number of the multi-frequency signals is less than a number of the MEMS signals of different functions with respective frequencies.

2. The method of multiple MEMS devices of claim 1, further comprising: transmitting the multi-frequency signals to a demodulator for separating the multi-frequency signals into a plurality of frequency responses; and analyzing sensing results of the MEMS devices according to the frequency responses.

3. The method of multiple MEMS devices of claim 1, wherein at least one of the MEMS signals with respective frequencies includes a major frequency response and at least one minor frequency response.

4. The method of multiple MEMS devices of claim 3, wherein the MEMS device generating the major frequency response and the at least one minor frequency response is an angular velocity sensor, and there is a 90° phase difference between the major frequency response and one of the at least one minor frequency response.

5. The method of multiple MEMS devices of claim 1, wherein at least one of the MEMS devices is a multi-dimensional acceleration sensor, which generates sensing signals having components in two or more dimensions.

6. The method of multiple MEMS devices of claim 5, further comprising: applying at least two different driving or modulating signals of two different frequencies to at least two of the components.

7. The method of multiple MEMS devices of claim 5, further comprising: applying one same vibration signal of one same frequency to at least two of the components.

8. The method of multiple MEMS devices of claim 1, wherein the step of applying driving or modulating signals of different frequencies to the MEMS devices includes: applying the driving or modulating signals by a mechanical vibration source or an electrical oscillation source.

9. The method of multiple MEMS devices of claim 1, wherein the at least two MEMS devices are integrated in a combo MEMS device.

10. A combo MEMS device, comprising:
    a plurality of MEMS devices of different functions including at least two of the following functions: sensing gravity, sensing acceleration, sensing angular velocity, and sensing angular acceleration;
    a plurality of vibration sources, for respectively generating a plurality of driving or modulating signals of different frequencies applied to the MEMS devices of different functions, such that the MEMS devices of different functions generate MEMS signals of corresponding different functions with respective frequencies; and
    at least one common node, for collecting the MEMS signals of corresponding different functions with respective frequencies generated by the MEMS devices when the MEMS devices receive the driving or modulating signals, combining the MEMS signals of corresponding different functions with respective frequencies into at least one multi-frequency signal, and outputting the multi-frequency signal;
    wherein a number of the common node is less than a number of the MEMS signals of corresponding different functions with respective frequencies.

11. The combo MEMS device of claim 10, wherein the at least two MEMS devices are integrated in a combo MEMS device.

12. The combo MEMS device of claim 10, wherein a number of the driving or modulating signals is the same as a number of the MEMS devices.

13. The combo MEMS device of claim 10, wherein at least one of the MEMS devices generates sensing signals having components in two or more dimensions, and a number of the driving or modulating signals is the same as a total number of the components of all the MEMS devices.

14. The combo MEMS device of claim 10, further comprising a processing unit, configured to receive the multi-frequency signals by a demodulator for separating the multi-frequency signals into a plurality of frequency responses, and configured to analyze sensing results of the MEMS devices according to the frequency responses.

15. A method for processing signals of multiple micro-electro-mechanical system (MEMS) devices, comprising:
    providing at least two MEMS devices;
    applying a plurality of driving or modulating signals of different frequencies to the MEMS devices such that the MEMS devices respectively generate a plurality of MEMS signals with respective frequencies;
    combining the MEMS signals with respective frequencies into one or more multi-frequency signals, and outputting the multi-frequency signals;
    separating the multi-frequency signals into a plurality of frequency responses; and
    analyzing sensing results of the MEMS devices of different functions according to the frequency responses;

wherein a number of the multi-frequency signals is less than a number of the MEMS signals with respective frequencies.

* * * * *